(12) United States Patent
Tseng et al.

(10) Patent No.: US 12,249,364 B2
(45) Date of Patent: Mar. 11, 2025

(54) APPARATUS WITH NON-LINEAR DELAY VARIATIONS FOR SCHEDULING MEMORY REFRESH OPERATIONS AND METHODS FOR OPERATING THE SAME

(71) Applicant: Micron Technology, Inc., Boise, ID (US)

(72) Inventors: Huai-Yuan Tseng, San Ramon, CA (US); Akira Goda, Tokyo (JP); Kishore Kumar Muchherla, Fremont, CA (US); James Fitzpatrick, Laguna Niguel, CA (US); Tomoharu Tanaka, Yokohama (JP); Eric N. Lee, San Jose, CA (US); Dung V. Nguyen, San Jose, CA (US); David Ebsen, Minnetonka, MN (US)

(73) Assignee: Micron Technology, Inc., Boise, ID (US)

( * ) Notice: Subject to any disclaimer, the term of this patent is extended or adjusted under 35 U.S.C. 154(b) by 212 days.

(21) Appl. No.: 17/890,040

(22) Filed: Aug. 17, 2022

(65) Prior Publication Data

US 2024/0062799 A1    Feb. 22, 2024

(51) Int. Cl.
*G11C 11/406* (2006.01)
*G11C 11/4076* (2006.01)
*G11C 11/408* (2006.01)

(52) U.S. Cl.
CPC .. *G11C 11/40615* (2013.01); *G11C 11/40618* (2013.01); *G11C 11/4076* (2013.01); *G11C 11/4085* (2013.01)

(58) Field of Classification Search
None
See application file for complete search history.

(56) References Cited

U.S. PATENT DOCUMENTS

| | | | | |
|---|---|---|---|---|
| 7,286,409 B1 * | 10/2007 | Chen | ................ | G11C 16/3418 365/210.1 |
| 7,447,096 B2 * | 11/2008 | Riekels | .............. | G11C 16/3431 365/185.12 |
| 9,589,660 B1 * | 3/2017 | Hashimoto | ........... | H10B 43/27 |
| 2003/0012064 A1 * | 1/2003 | Beretta | ............. | G11C 16/3418 365/200 |
| 2006/0245251 A1 * | 11/2006 | Shirota | ............. | G11C 16/0483 365/185.17 |
| 2008/0005456 A1 * | 1/2008 | Watanabe | ......... | G11C 16/3431 711/106 |
| 2010/0207189 A1 * | 8/2010 | Kellam | ................ | H01L 29/792 257/E21.24 |
| 2013/0070530 A1 * | 3/2013 | Chen | ................ | G11C 11/5628 365/185.11 |

* cited by examiner

*Primary Examiner* — J. H. Hur
(74) *Attorney, Agent, or Firm* — Perkins Coie LLP

(57) ABSTRACT

Methods, apparatuses and systems related to maintaining stored data are described. The apparatus may be configured to refresh the stored data according to schedule that includes different delays between successive refresh operations.

21 Claims, 7 Drawing Sheets

APPARATUS WITH NON-LINEAR DELAY VARIATIONS FOR SCHEDULING MEMORY REFRESH OPERATIONS AND METHODS FOR OPERATING THE SAME

TECHNICAL FIELD

The disclosed embodiments relate to devices, and, in particular, to semiconductor memory devices with preloaded information and methods for operating the same.

BACKGROUND

Memory systems can employ memory devices to store and access information. The memory devices can include volatile memory devices, non-volatile memory devices (e.g., flash memory employing "NAND" technology or logic gates, "NOR" technology or logic gates, or a combination thereof), or a combination device. The memory devices utilize electrical energy, along with corresponding threshold levels or processing/reading voltage levels, to store and access data. However, the performance or characteristics of the memory devices change or degrade over time, usage, or environmental conditions. The change in performance or characteristics conflicts with the threshold or processing voltage levels over time, leading to errors and other performance issues. The changed performance is further worsened as the memory devices grow denser (e.g., storing increased number bits per cell). The increased density corresponds to a decrease in the separation in the threshold voltage levels, which causes the negative impact of the changed performance to worsen.

BRIEF DESCRIPTION OF THE DRAWINGS

The foregoing and other objects, features, and advantages of the disclosure will be apparent from the following description of embodiments as illustrated in the accompanying drawings, in which reference characters refer to the same parts throughout the various views. The drawings are not necessarily to scale, emphasis instead being placed upon illustrating principles of the disclosure.

DETAILED DESCRIPTION

As described in greater detail below, the technology disclosed herein relates to an apparatus, such as memory systems, systems with memory devices, related methods, etc., for controlling refresh operation timing. In some embodiments, a memory device (e.g., a NAND memory) can perform the refresh operation according to a non-linear (e.g., logarithmic) pattern.

Technological advances are allowing memory cells (e.g., NAND Flash memory cells) to store an increasing number of bits. The storage capacity for memory cells can be represented as bit(s) per cell (BPC). For example, single-level cells (SLCs) can have 1 BPC capacity, multi-level cells (MLCs) can have 2 BPC capacity, triple-level cells (TLCs) can have 3 BPC capacity, and quad-level cells (QLCs) can have 4 BPC. Increasing the BPC can reduce the cost per bit for a given die size since more bits can be stored in a single wafer. However, the additional capacity must often be implemented within a given threshold voltage (Vt) window.

Figure 1A:
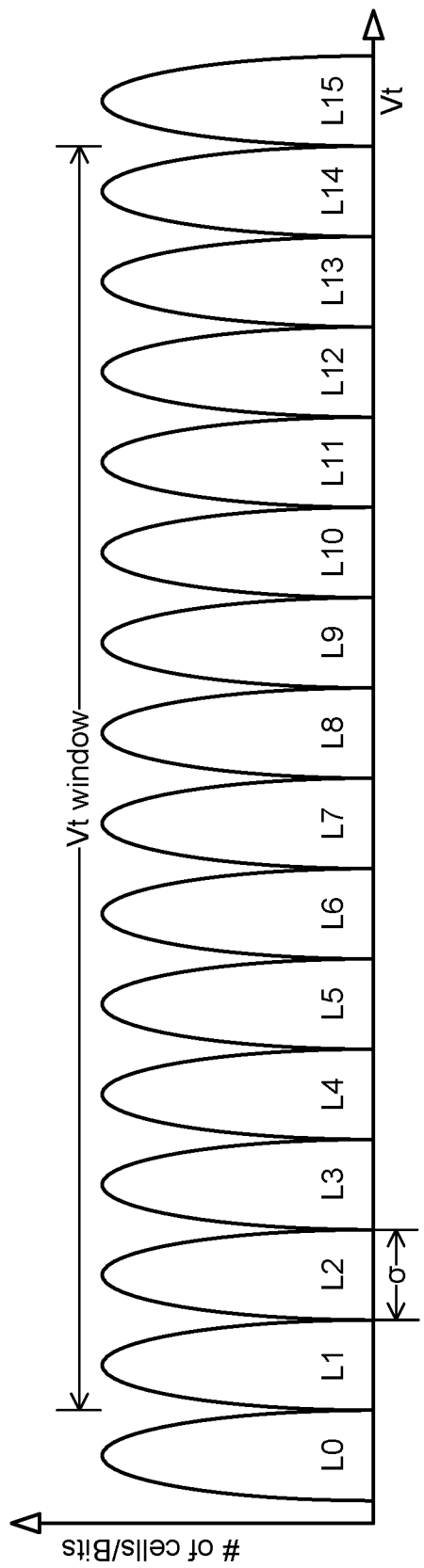
FIG. 1A and FIG. 1B are illustrations of example voltage thresholds for different memory densities.
Figure 1B:
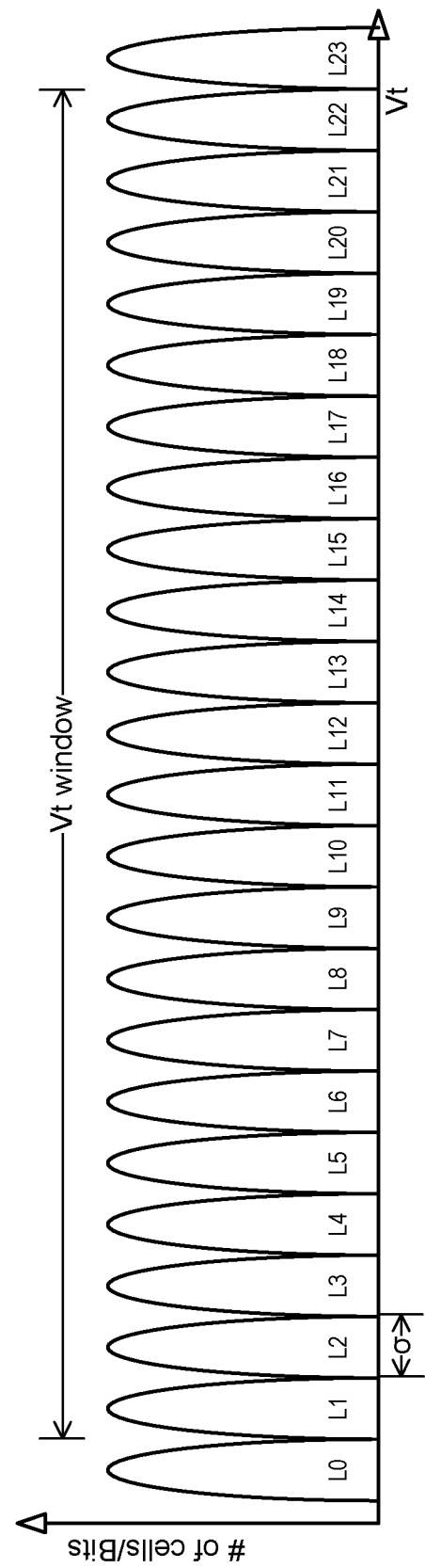

FIG. 1A and FIG. 1B are illustrations of example voltage thresholds for different memory densities. FIG. 1A illustrates Vt distribution of QLC that can store one of 16 different bit values, and FIG. 1B illustrates Vt distribution of 4.5 BPC that can store one of 24 different bit values. However, an overall range or window for the Vt can remain largely unchanged. As such, memory cells may require smaller placement ranges (e.g., Vt ranges corresponding to specific bit values, also referred to as 'σ') to accommodate additional possible bit values or corresponding number of levels in stored charges. As illustrated in FIGS. 1A and 1B for example, adding eight additional states to transition from QLC to 4.5 BPC cell can drastically reduce the a.

The reduction in σ can present a variety of challenges. One such challenge is to maintain the integrity of the data across time. Storage cells may be susceptible to charge loss. As such, the stored charges in the cells may change, and the corresponding Vt may change over time. However, with the reduced a, the same charge loss rate can cause higher rates of data corruptions or errors.

To improve the integrity of the stored data, embodiments of the present technology can perform touch up (TU) or refresh operations to offset/reverse the charge loss and maintain the stored charges within the targeted σ. In some embodiments, the memory device can perform the TU operations according to a non-linear (e.g., logarithmic) pattern. In other words, between successive TU operations, the memory device can use different delay durations that change/grow according to a non-linear pattern. For example, if the first performance of the TU operation occurs after x hours, the second TU can occur x*10 hours after the first TU, the third TU can occur x*100 hours after the second TU, and so on.

Additionally or alternatively, the memory device can adjust or vary the delay for discharge operations across word lines (WLs). In other words, the memory device can implement/perform WL staggered discharge. The staggered discharge pattern may be performed by increasing the delay for WLs farther away from a selected WL. The memory device may perform the staggered discharge on one or both side of the selected WL. In some embodiments, the memory device can perform one or two-sided staggered discharge according to a position of the selected WL. Details regarding the non-linear or staggered timing of the TU operations and the staggered discharge operations are described below.

Example Environment

Figure 2:
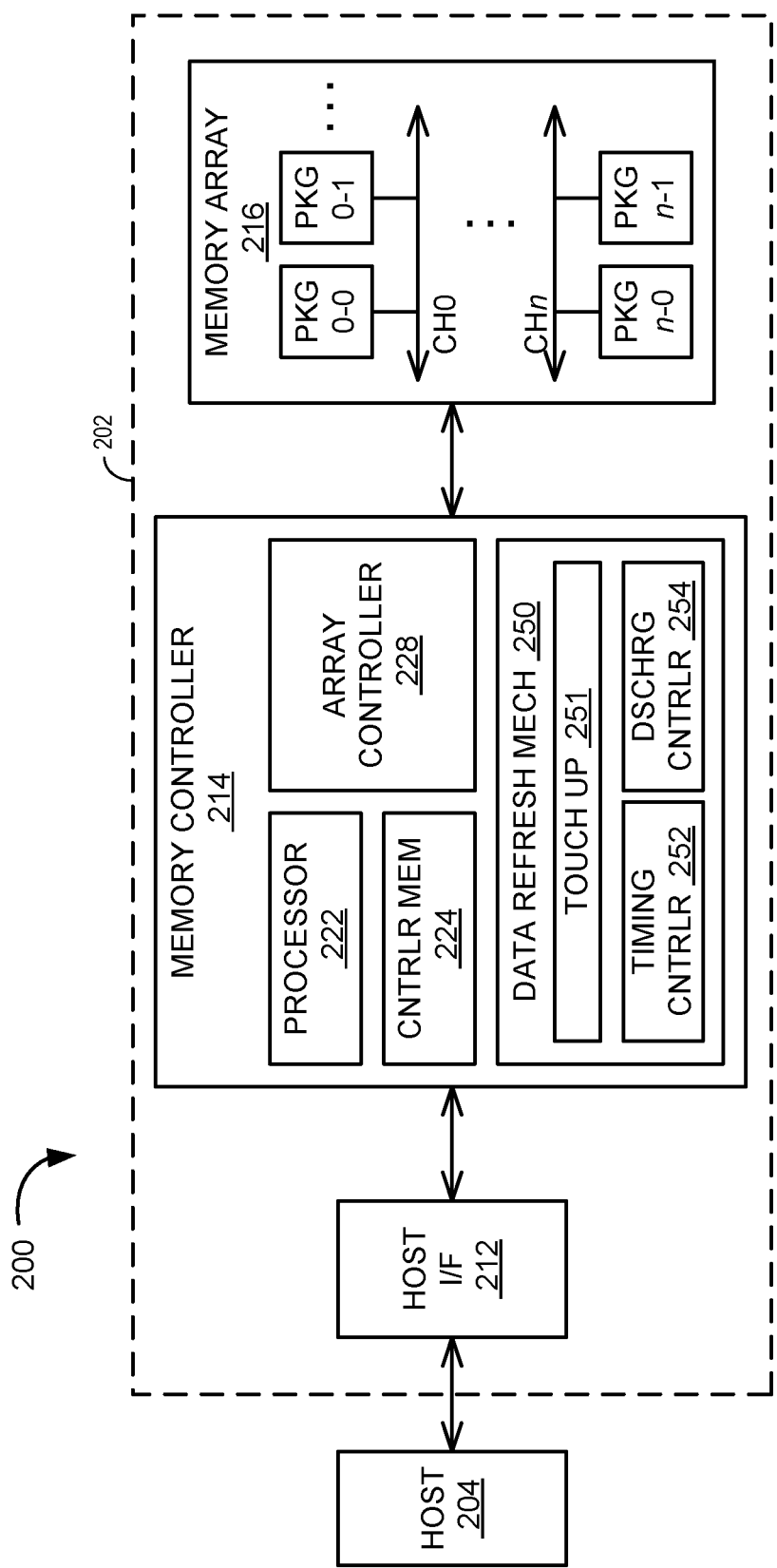
FIG. 2 is a block diagram of a computing system in accordance with an embodiment of the present technology.

FIG. 2 is a block diagram of a computing system 200 in accordance with an embodiment of the present technology. The computing system 200 can include a personal computing device/system, an enterprise system, a mobile device, a server system, a database system, a distributed computing system, or the like. The computing system 200 can include a memory system 202 coupled to a host device 204. The host device 204 can include one or more processors that can write data to and/or read data from the memory system 202. For example, the host device 204 can include an upstream central processing unit (CPU).

The memory system 202 can include circuitry configured to store data (via, e.g., write operations) and provide access to stored data (via, e.g., read operations). For example, the memory system 202 can include a persistent or non-volatile data storage system, such as a NAND-based Flash drive system, a Solid-State Drive (SSD) system, a SD card, or the like. In some embodiments, the memory system 202 can include a host interface 212 (e.g., buffers, transmitters, receivers, and/or the like) configured to facilitate communications with the host device 204. For example, the host interface 212 can be configured to support one or more host interconnect schemes, such as Universal Serial Bus (USB), Peripheral Component Interconnect (PCI), Serial AT Attachment (SATA), or the like. The host interface 212 can receive commands, addresses, data (e.g., write data), and/or other information from the host device 204. The host interface 212 can also send data (e.g., read data) and/or other information to the host device 204.

The memory system 202 can further include a memory controller 214 and a memory array 216. The memory array 216 can include memory cells that are configured to store a unit of information. The memory controller 214 can be configured to control the overall operation of the memory system 202, including the operations of the memory array 216.

In some embodiments, the memory array 216 can include a set of NAND Flash devices or packages. Each of the packages can include a set of memory cells that each store data in a charge storage structure. The memory cells can include, for example, floating gate, charge trap, phase change, ferroelectric, magnetoresistive, and/or other suitable storage elements configured to store data persistently or semi-persistently. The memory cells can be one-transistor memory cells that can be programmed to a target state to represent information. For instance, electric charge can be placed on, or removed from, the charge storage structure (e.g., the charge trap or the floating gate) of the memory cell to program the cell to a particular data state. The stored charge on the charge storage structure of the memory cell can indicate a Vt of the cell. For example, a SLC can be programmed to a targeted one of two different data states, which can be represented by the binary units 1 or 0. Also, some flash memory cells can be programmed to a targeted one of more than two data states. MLCs may be programmed to any one of four data states (e.g., represented by the binary 00, 01, 10, 11) to store two bits of data. Similarly, TLCs may be programmed to one of eight (i.e., $2^3$) data states to store three bits of data, and QLCs may be programmed to one of 16 (i.e., $2^4$) data states to store four bits of data.

Such memory cells may be arranged in rows (e.g., each corresponding to a word line) and columns (e.g., each corresponding to a bit line). The arrangements can further correspond to different groupings for the memory cells. For example, each word line can correspond to one or more memory pages. Also, the memory array 216 can include memory blocks that each include a set of memory pages. In operation, the data can be written or otherwise programmed (e.g., erased) with regards to the various memory regions of the memory array 216, such as by writing to groups of pages and/or memory blocks. In NAND-based memory, a write operation often includes programming the memory cells in selected memory pages with specific data values (e.g., a string of data bits having a value of either logic 0 or logic 1). An erase operation is similar to a write operation, except that the erase operation re-programs an entire memory block or multiple memory blocks to the same data state (e.g., logic 0).

While the memory array 216 is described with respect to the memory cells, it is understood that the memory array 216 can include other components (not shown). For example, the memory array 216 can also include other circuit components, such as multiplexers, decoders, buffers, read/write drivers, address registers, data out/data in registers, etc., for accessing and/or programming (e.g., writing) the data and for other functionalities.

As described above, the memory controller 214 can be configured to control the operations of the memory array 216. The memory controller 214 can include a processor 222, such as a microcontroller, special purpose logic circuitry (e.g., a field programmable gate array (FPGA), an application specific integrated circuit (ASIC), etc.), or other suitable processor. The processor 222 can execute instructions encoded in hardware, firmware, and/or software (e.g., instructions stored in controller-embedded memory 224 to execute various processes, logic flows, and routines for controlling operation of the memory system 202 and/or the memory array 216.

Further, the memory controller 214 can further include an array controller 228 that controls or oversees detailed or targeted aspects of operating the memory array 216. For example, the array controller 228 can provide a communication interface between the processor 222 and the memory array 216 (e.g., the components therein). The array controller 228 can function as a multiplexer/demultiplexer, such as for handling transport of data along serial connection to flash devices in the memory array 216.

In some embodiments, the memory system 202 can include a data refresh mechanism 250 configured to maintain the integrity of data stored within the memory array 216 over time. The data refresh mechanism 250 can perform a background operation, such as a touch up (TU) operation 251, that restores the levels of stored charges to be within the placement ranges a of originally-intended bit values. For example, the memory system 202 can be configured to periodically read each memory page within the memory array 216. The memory system 202 can perform an error-correction algorithm using error-correction code (ECC) to remove the errors/corruptions that may occur due to the loss of charge over time. Also, the memory system 202 can remap the page, reprogram the page, or a combination thereof to refresh the charge levels and maintain the integrity of the stored data. The data refresh mechanism 250 can include circuits, software instructions, and/or firmware configurations performed via the processor, the controller-embedded memory 224, the array controller 228, the memory array 216, a separate dedicated logic, or a combination thereof.

In performing the TU operations 251, the data refresh mechanism 250 can include a refresh timing controller 252 configured to control a timing for initiating such operations. In other words, the refresh timing controller 252 can determine when to perform the TU operation 251 during manufacturing (e.g., device setup or configuration) and/or deployed operations of the memory system 202. In some embodiments, the refresh timing controller 252 can be configured to vary or increase the delay or temporal separation between each successive performance of the TU operation 251. The refresh timing controller 252 can be configured to vary the delay according to a predetermined pattern. For example, the refresh timing controller 252 can increase the delay according to a logarithmic pattern.

Additionally or alternatively, the data refresh mechanism 250 can include a discharge controller 254 configured to control discharge timings of adjacent/successive WLs, such as at the end of reading a target WL. For example, the discharge controller 254 can be configured to vary the discharge timings of adjacent/successive WLs, such as to prevent simultaneous or contemporaneous discharge of the adjacent WLs. In some embodiments, the discharge controller 254 can successively increase the delay as distance/position WLs increase. Details regarding the discharge controller 254 and the refresh timing controller 252 are described below.

Charge Loss and Touch Up

Figure 3A:
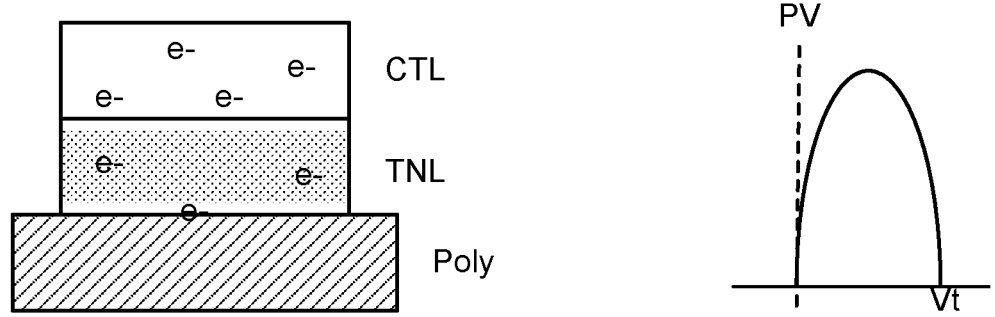
FIG. 3A, FIG. 3B, and FIG. 3C are illustrations of charge loss and touch up in accordance with an embodiment of the present technology.
Figure 3B:
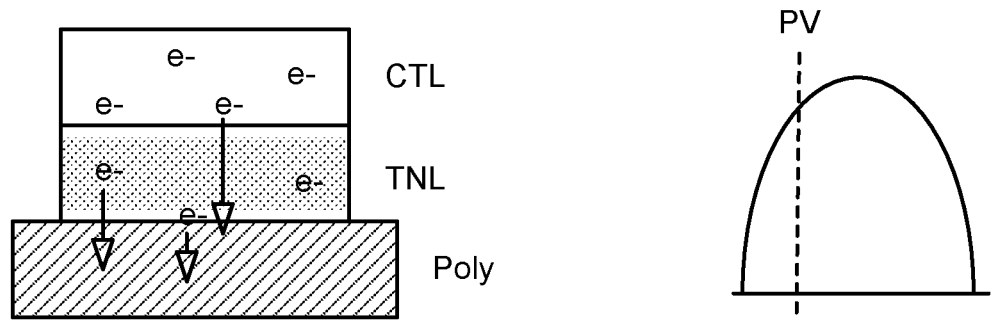
Figure 3C:
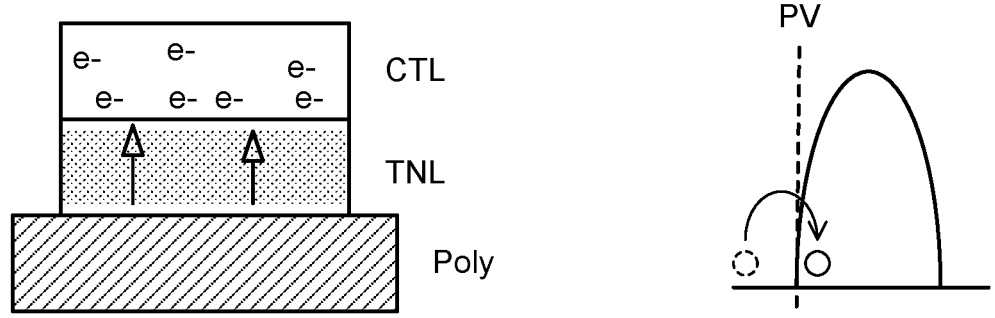

To provide the context regarding the data refresh mechanism 250, FIG. 3A, FIG. 3B, and FIG. 3C are illustrations of charge loss and touch up in accordance with an embodiment of the present technology. FIG. 3A illustrates charge distributions within a single cell and Vt distribution of multiple cells (e.g., relative to a program-verify level) for a given bit value following initial programming operations. When a memory cell is programmed, at least a targeted amount of charges are stored in a charge trapping layer (CTL) to represent the corresponding bit value. During the write/programming operation, some charges may inadvertently occur or be placed in a tunneling layer (TNL) and/or a semiconductor substrate (poly) layer.

At the end of the write/programming operation, the memory system 202 can read or verify the result to ensure accuracy. Effectively, the memory system 202 can perform the verification to ensure that the stored charges exceed a program-verify (PV) level that corresponds to the targeted bit value. Different cells may retain different amounts of charges in the CTL, thus resulting in a concaved shaped curve for the Vt distribution for cells storing a given bit value.

FIG. 3B illustrates the loss of charge with respect to both an individual cell and the Vt distribution. The charge loss can correspond to migrations of charges from the CTL to other locations within the memory cell, such as TNL and/or poly. Such displacement of the stored charges can effectively reduce the Vt. Since the memory cells can suffer or experience the charge loss at different rates, the Vt for cells storing a given bit value can change at different rates. Thus, the Vt distribution for a given bit value can decrease (e.g., shift to the left) and/or widen. Some of the cells having lower Vt at initial programming and/or experiencing faster/greater charge loss may shift below the PV level. Effectively, the memory cells with Vt values shifting below the PV level can experience data corruption and reflect a different bit value than the initially stored bit value.

FIG. 3C illustrates the effects of the TU operations 251 of FIG. 2 both at the individual memory cell and the Vt distribution. As described above, the TU operations 251 can restore the amounts of charges in the CTL for each refreshed cell. As a result, the TU operations 251 can increase the Vt of cells across (i.e., from below to above) the PV level and maintain/restore the accurate data value. Accordingly, the TU operations 251 can increase (e.g., shift to the right) the Vt distribution and/or laterally condense or narrow the distribution shape.

Touch Up Timing

Figure 4:
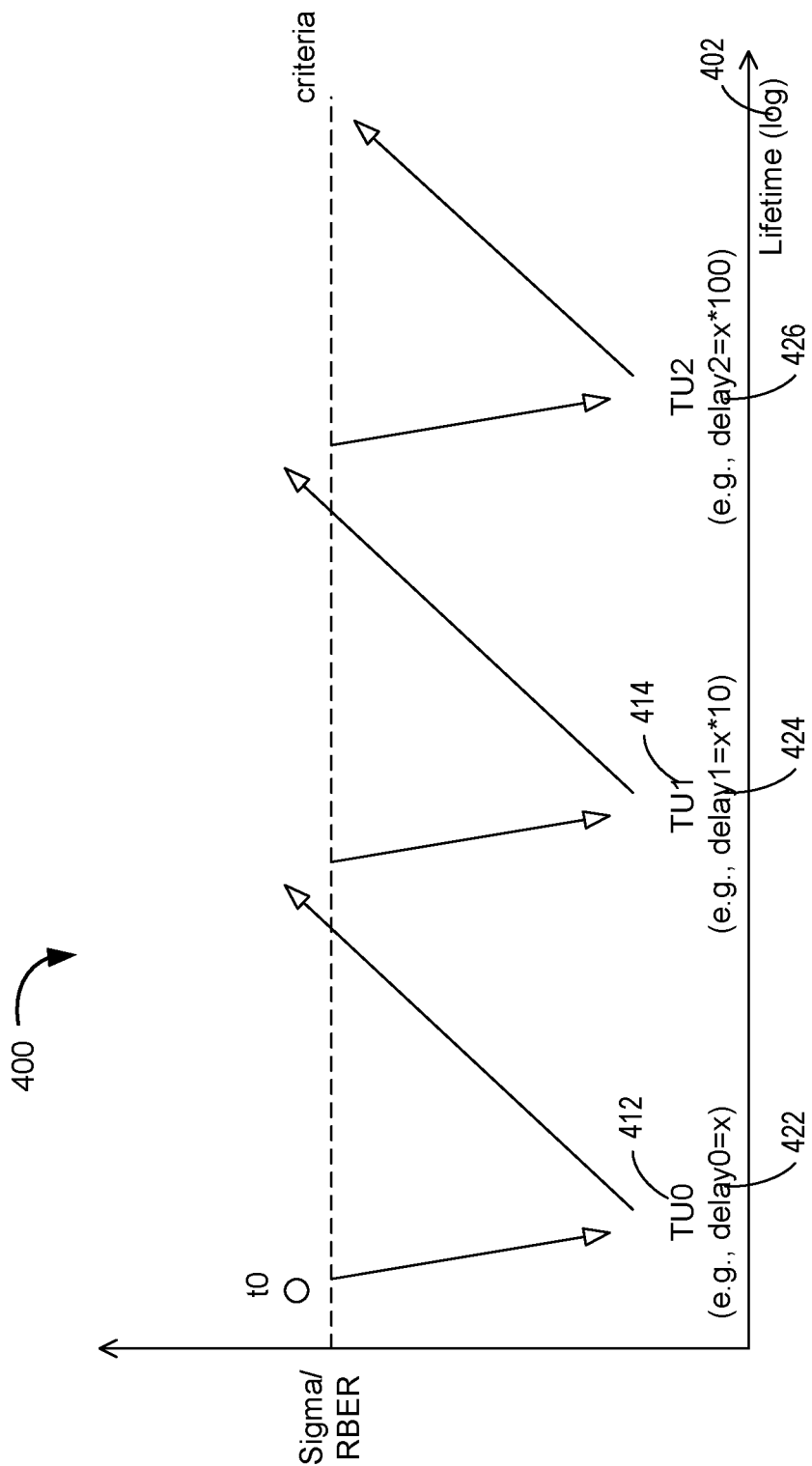
FIG. 4 is an illustration of non-linear refresh timing in accordance with an embodiment of the present technology.

The memory system 202 can include the refresh timing controller 252 of FIG. 2 to initiate the TU operations 251. As described above, in some embodiments, the refresh timing controller 252 can vary the timing by increasing delays between successive TU operations 251 according to a non-linear pattern. FIG. 4 is an illustration of non-linear refresh timing 400 in accordance with an embodiment of the present technology.

The refresh timing controller 252 can perform the background TU operations 251 according to a non-linear pattern 402. In other words, the refresh timing controller 252 can adjust or increase delays between successive TU operations 251 can according to the non-linear pattern 402, such as according to a logarithmic pattern. For example, the refresh timing controller 252 can be configured to perform a first/initial TU operation 412 (e.g., TU0) at t0 or after a relatively short first/initial delay 422 (e.g., x=0.5-10 hours when the a is less than 100 mV). Between the initial TU operation 412 and a second TU 414 (e.g., TU1), the refresh timing controller 252 can use a second delay 424 (e.g., 10*x) that is longer than the first delay 422. The refresh timing controller 252 can use a third delay 426 (e.g., 100*x) that is longer than the second delay 424, such as according to a logarithmic scale.

The refresh timing controller 252 can trigger the initial TU operation 412 according to a predetermined delay. Alternatively, the refresh timing controller 252 can dynamically trigger the initial TU operation according to one or more predetermined criteria. In other words, the refresh timing controller 252 can trigger the initial TU operation according to a real-time condition of the data stored in the memory array 116. For example, the refresh timing controller 252 can dynamically trigger the initial TU operation according to the RWB, an error rate (e.g., RBER), or a combination thereof.

Following the initial TU operation, the refresh timing controller 252 can compute (via, e.g., a predetermined process/equation) one or more successive delays according to the non-linear pattern. In some embodiments, the refresh timing controller 252 can update a threshold or an initial timer value used to perform the next TU operation and/or the corresponding probe.

Post-Read Discharge

Figure 6:
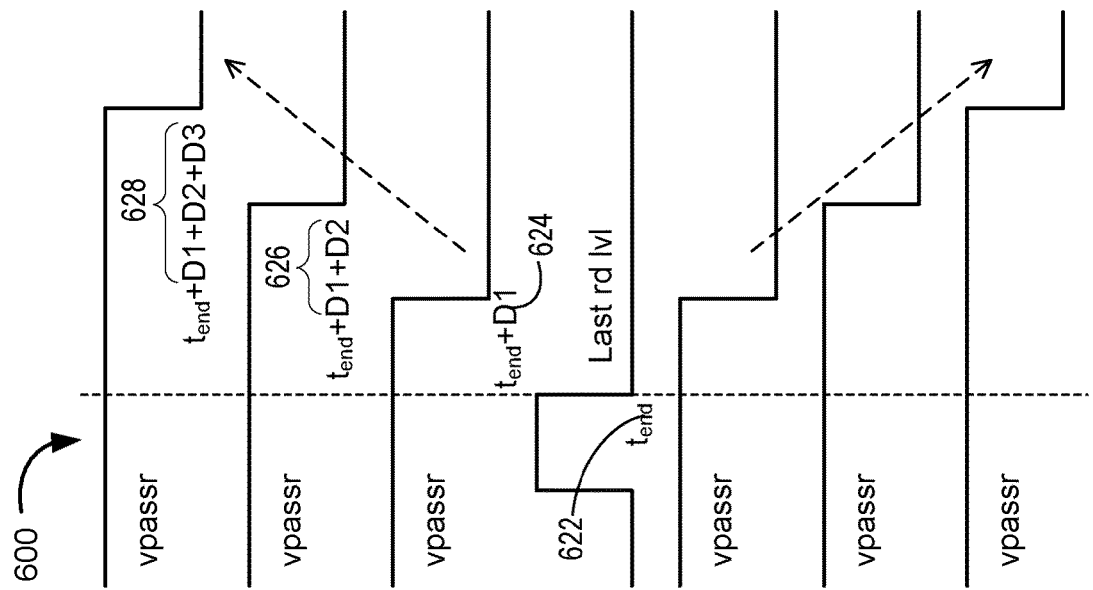
FIG. 6 is an illustration of a staggered discharge operation in accordance with an embodiment of the present technology.
Figure 5:
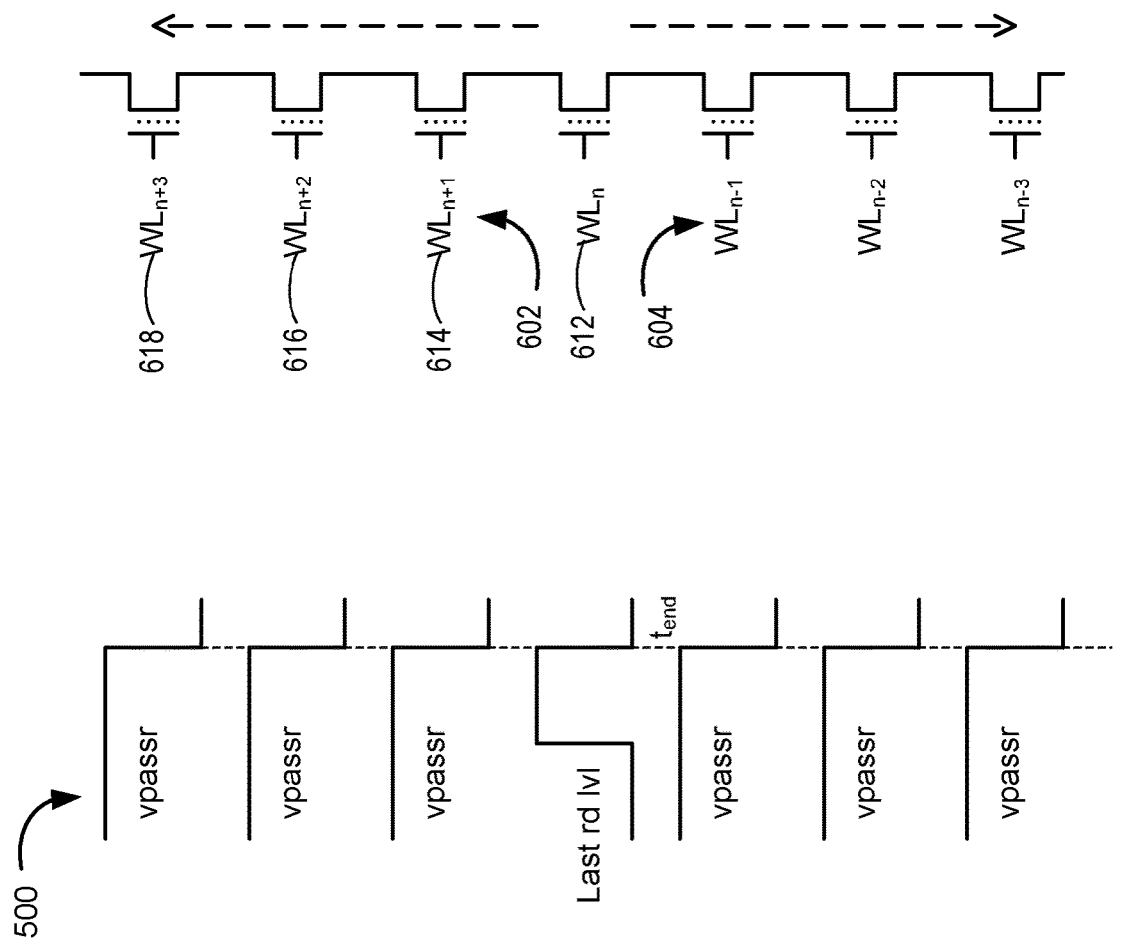
FIG. 5 is an illustration of a discharge operation in accordance with an embodiment of the present technology.

FIG. 5 is an illustration of a simultaneous discharge operation 500 in accordance with an embodiment of the present technology. In comparison to the simultaneous discharge operation 500, FIG. 6 is an illustration of a staggered discharge operation 600 in accordance with an embodiment of the present technology. Referring to FIG. 5 and FIG. 6 together, the discharge operations 500 and 600 can correspond to operations for discharging power after a read operation. FIG. 5 and FIG. 6 illustrate an example of performing a last read operation and removing corresponding power at $t_{end}$ at a selected wordline $WL_n$ and at WLs $WL_{n+1}$, $WL_{n+2}$, etc. and/or $WL_{n-1}$, $WL_{n-2}$, etc. physically adjacent to $WL_n$. Accordingly, FIG. 5 and FIG. 6 illustrate positive pass-gate read voltages (vpassr) for the different WLs.

In some embodiments, the memory system 102 can perform the simultaneous discharge operation 500 and simultaneously/concurrently discharge the related WLs (e.g., $WL_n$, along with $t_{end}$. $WL_{n+1}$, $WL_{n+2}$, etc. and/or $WL_{n-1}$, $WL_{n-2}$, etc.), such as at $t_{end}$. In other embodiments, the memory system 102 (via, e.g., the discharge controller 254 of FIG. 2) can control the discharge timings of the related WLs and perform the staggered discharge operation 600. Forex ample, when the read operation ends with a pulse at a selected WL 612 at a reference time 622 ($t_{end}$), the discharge controller 254 can delay the discharge timings of other related/adjacent WLs. For the example illustrated in FIG. 6, the discharge controller 254 can discharge one or more first/immediately adjacent WLs 614 (e.g., $WL_{n+1}$ and/or $WL_{n-1}$) after a first delay 624 (D1). The discharge controller 254 can discharge one or more second/next proximate WLs 616 (e.g., $WL_{n+2}$ and/or $WL_{n-2}$) after a second delay 626 (D1+D2) that is greater than the first delay 624. Similarly, the discharge controller 254 can discharge one or more third/next proximate WLs 618 (e.g., $WL_{n+3}$ and/or $WL_{n-3}$) after a third delay 628 (D1+D2+D3) that is greater than each of the first delay 624 and the second delay 626. The memory system 102 can use the staggered discharge operation 600 during (e.g., at the end of reads/probes) the TU operation 251 of FIG. 2.

The memory system 102 can perform the staggered discharge operation 600 across a predetermined number (e.g., a set of one to five adjacent WLs on each side) of WLs. Moreover, the memory system 102 can perform the staggered discharge operation 600 across one or more sides of WLs relative to the selected WL 612. In some embodiments, the differences between the first delay 624, the second delay 626, and the third delay 628 can be identical (e.g., D1=D2=D3). In other embodiments, the differences between the delays can be different or dynamically adjusted. Additionally or alternatively, in some embodiments, the discharge controller 254 can perform the staggered discharge operation 600 across WLs on multiple/both sides, such as a first side WLs 602 and a second side WLs 604. The staggered discharge operation 600 can perform the staggered discharge operation 600 for matching number of WLs on the multiple/both sides. In other embodiments, the discharge controller 254 can perform the staggered discharge operation 600 on one side, such as on either the first side WLs 602 or the second side WLs 604. In one or more embodiments, the discharge controller 254 can selectively perform the staggered discharge operation 600 on one side, such as when the selected WL 612 is within a threshold range from a boundary.

The memory system 202 can use the staggered discharge operation 600 to ensure that the potential at the selected WL 612 returns to electrical ground. The staggered discharge operation 600 can be used to shorten the discharge window for each WL.

Control Flow

Figure 7:
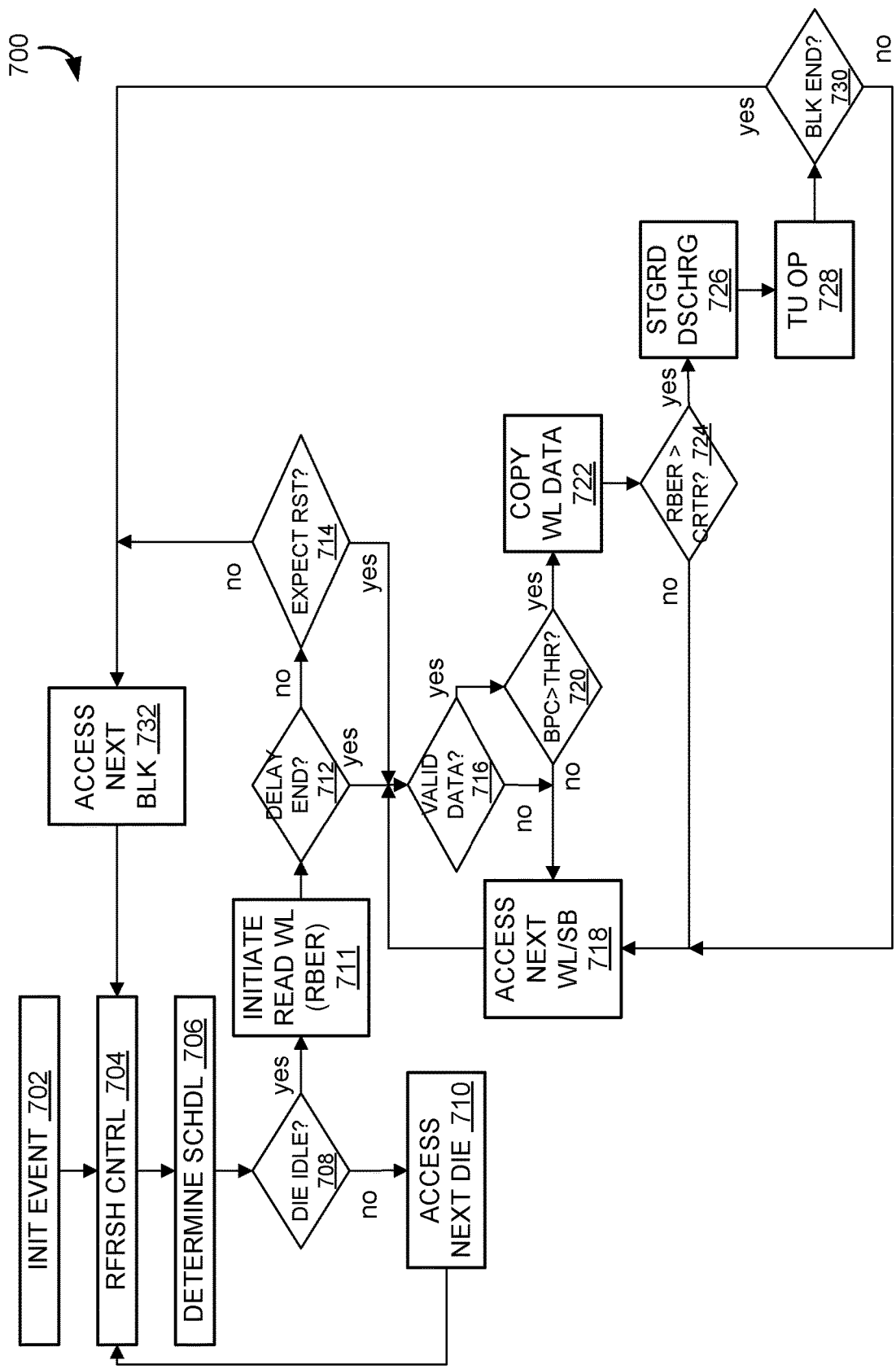
FIG. 7 is a flow diagram illustrating an example method of manufacturing/operating an apparatus in accordance with an embodiment of the present technology.

FIG. 7 is a flow diagram illustrating an example method 700 of operating an apparatus (e.g., the computing system 100, the memory system 102, the memory controller 114, and/or other circuits illustrated in FIG. 1) in accordance with an embodiment of the present technology. The method 700 can be for implementing the data refresh mechanism 250 of FIG. 1. In other words, the method 700 can be for performing, according to a schedule (e.g., the non-linear refresh timing 400 of FIG. 4), a data refresh operation (e.g., the TU operation 251 of FIG. 2) that offsets or reverses the charge loss and maintains the accuracy of the stored data.

At block 702, the apparatus can detect an initiating event. In some embodiments, the initiating event can correspond to an ending portion of a manufacturing process and/or a beginning portion of a deployed use or a targeted state. Some examples of the initiating event can include a change in a device state (e.g., transition from a test mode to normal operating mode), an end of a test operation, a change in a pin connection or a non-volatile (e.g., fuse) setting, or the like.

At block 704, the apparatus can initiate the refresh control for a selected die and a selected block therein. The apparatus (via, e.g., the memory controller) can iteratively select a circuit (e.g., a combination of a die, a block, and a WL) in the memory array 116. The apparatus can select a predetermined default circuit for a first iteration of the refresh control/method 700.

At block 706, the apparatus can determine the refresh schedule for performing the TU operation 251. In some embodiments, the apparatus can determine the refresh schedule by accessing a predetermined schedule that specifies a set of delays. From the accessed schedule, the apparatus can determine the appropriate/ongoing delay for the current iteration or performance of the TU operation 251. In other embodiments, the apparatus can compute the appropriate delay duration according to the number previously performed TU operations 251 for the selected circuit.

The refresh schedule can include or define different delays between successive performing of the TU operations 251 for the selected circuit. The differences in the successive delays can follow a non-linear pattern, such as a logarithmic pattern or other patterns where the differences change/increase by at least an order of magnitude across successive performances. For example, the first delay 422 of FIG. 4 can be n hours between a device-initialization event and a first performance of the touch up operation. The second delay 424 of FIG. 4 can be greater than the first delay 422 by at least a factor of 10. The third delay 426 of FIG. 4 can be greater than the second delay 424 by at least a factor of 10. In some embodiments, the apparatus can determine the schedule and the delays for memory cells/WLs that correspond to at least a threshold number (e.g., QLC or BPC of 4 or greater) of the BPC capacity. In one or more embodiments, the apparatus can determine the schedule that includes a limited number (e.g., three, four, or five) of delay values. For subsequent performances of the TU operation 251, the apparatus can continue to use the last/longest listed delay value, use a predetermined/fixed delay value, or dynamically trigger the TU operations 251 based on real-time conditions (e.g., error rates) of the memory array 116.

For the first performance of the TU operation 251, the apparatus can set a counter to track the appropriate first delay and initiate the counter. For subsequent iterations/performances of the TU operation 251, the apparatus can set the counter to a next delay and start the counter after each performance of the TU operation 251.

In performing the touch up operation according to the non-linear schedule, the apparatus can be configured to additionally determine appropriate timing. For example, the apparatus can determine whether or not a selected die is in an idle state as illustrated at decision block 708. Accordingly, the apparatus can perform the TU operation 251 as a background operation without interfering with active or host-commanded memory operations.

When the die is actively performing operations (e.g., not idle), the apparatus can access/select the next die as illustrated at block 710. Subsequently, the flow can continue to block 704, and the apparatus can initiate the refresh control for the selected next die. In other words, the apparatus can move on to refresh an idle die and return to refresh the active die at a later time.

When the die is idle, the apparatus can determine one or more real-time conditions or states of the selected circuit. For example, the apparatus can initiate a read for a selected WL as illustrated at block 711. The apparatus can start the read to obtain a raw bit error rate (RBER) associated with the selected WL. Also, the apparatus can determine whether the touch up performance delay has ended (e.g., the counter reaching an end) for the selected circuit as illustrated at decision block 712.

When the delay is active/ongoing (e.g., not ended), the apparatus can determine whether a reset or a power off operation is expected as illustrated at decision block 714. The apparatus can determine whether the reset is expected based on a scheduled operation, a received command, and/or a history regarding such operation. When the reset is not expected, the apparatus can access a next block as illustrated at block 732.

When the delay is inactive (e.g., has ended) or when the reset is expected, the apparatus can determine another real-time condition, such as whether the selected WL holds valid data as illustrated at decision block 716. When the stored data is not valid, the apparatus can pass the selected WL since refresh is unnecessary. Accordingly, at block 718, the apparatus can access the next WL. When the stored data is valid, the apparatus can determine whether the selected memory cell has a BPC greater than a density threshold as illustrated at decision block 720. In some embodiments, when the BPC of the selected cell is not greater than the threshold, the apparatus can ignore the less dense memory cell (e.g., without performing the TU operation) and access the next WL as illustrated at block 718.

When the BPC of the selected memory cell is greater than the density threshold, the apparatus can copy the valid data stored in the selected WL as illustrated at block 722. For example, the apparatus can store the copied data in a page buffer. The apparatus can obtain the RBER based on the copied data.

At decision block 724, the apparatus can determine whether the RBER is higher than a predetermined criterion (e.g., as illustrated in FIG. 4). When the RBER is not higher than the predetermined criterion, the apparatus can access the next WL as illustrated at block 718. Otherwise, when the RBER is higher than the predetermined criterion, the apparatus can perform the staggered discharge 600 of FIG. 6 as illustrated at block 726. In other words, the apparatus can take additional steps, via the staggered discharge 600, at an end portion of a data access operation to ensure proper operating states at more troublesome circuits. For example, the apparatus can use the staggered discharge 600 to discharge the WLs surrounding the selected WL at different times following the reference time 622 of FIG. 6 for ensuring that a pillar potential returns to a reset level. The apparatus can use the staggered discharge 600 to discharge one or more first adjacent WLs 614 of FIG. 6 physically located directly adjacent to the selected WL 612 following the first delay 624 measured from the reference time 622. The apparatus can use a longer/second delay to discharge the next adjacent WLs. Accordingly, in some embodiments, the apparatus can be configured to discharge an adjacent set of one to five WLs on one or each opposing sides of the selected WL 312. When one discharging one side, such as when the selected WL is within a threshold location/position from a peripheral edge/boundary of the array structure, the apparatus can ignore the WL(s) between the selected WL and the boundary.

At block 728, the apparatus can perform/complete the touch up operation. For example, the apparatus can transfer the WL data from the page buffer to the same or new WL. The apparatus can increment and track the number of touch up operations that have been performed for the selected die/block/WL/etc. since the initiating event.

At decision block 730, the apparatus can determine whether the selected/touched up WL is at the end of the selected block (e.g., last WL in the block). When the WL is not the end of the block, the apparatus can access the next WL as illustrated at block 718. Otherwise, the apparatus can access/select the next memory block as illustrated at block 732.

The apparatus can perform or execute the method 700 or one or more portions thereof to maintain the stored charges within the appropriate a windows. Accordingly, the apparatus can increase the read window budget (RWB) and reduce the error rates for multistate/multibit memory cells. Also, the apparatus can increase the BPC density via the maintained charge levels and increase the efficiency and the storage capacity. Moreover, the apparatus can use the non-linear/logarithmic schedule for the refresh operations, thereby closely tracking the actual behavior of the memory cells across time and refresh operations and increasing resource efficiencies for the background refresh.

Figure 8:
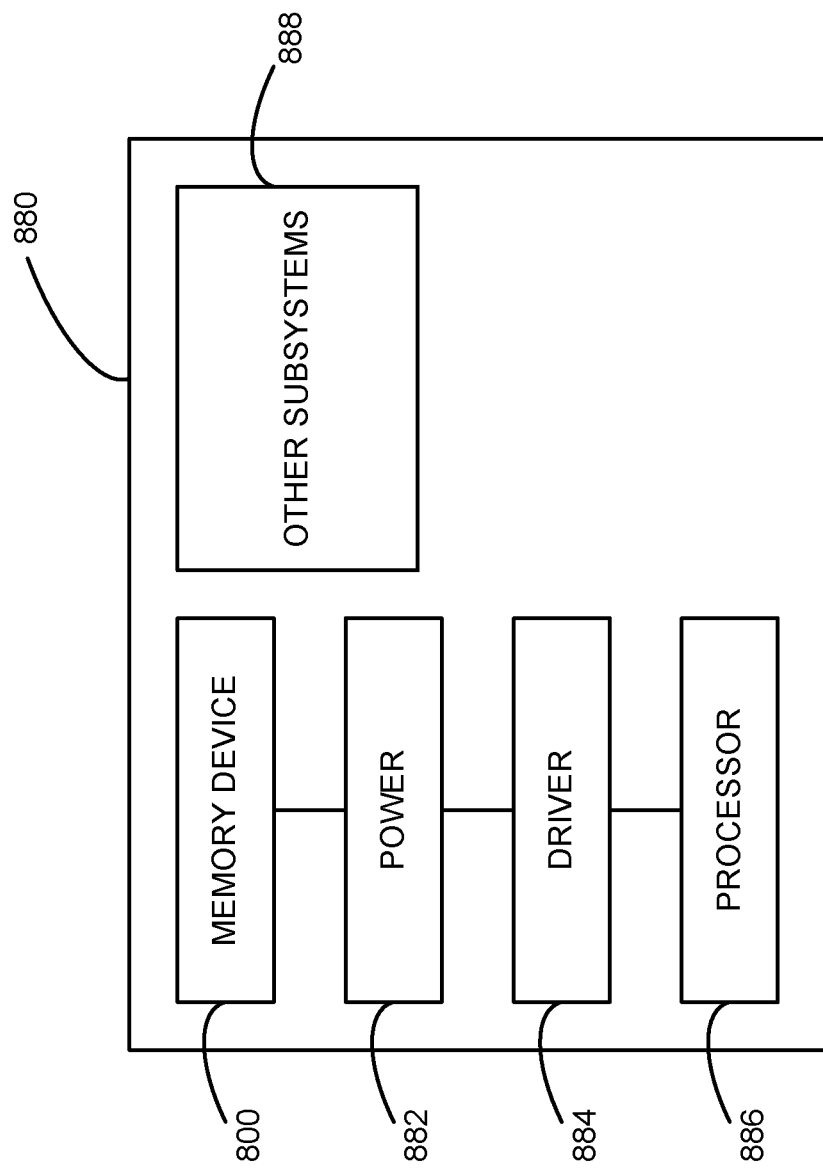
FIG. 8 is a schematic view of a system that includes an apparatus in accordance with an embodiment of the present technology.

FIG. 8 is a schematic view of a system that includes an apparatus in accordance with embodiments of the present technology. Any one of the foregoing apparatuses (e.g., memory devices) described above with reference to FIGS. 1A-7 can be incorporated into any of a myriad of larger and/or more complex systems, a representative example of which is system 880 shown schematically in FIG. 8. The system 880 can include a memory device 800, a power source 882, a driver 884, a processor 886, and/or other subsystems or components 888. The memory device 800 can include features generally similar to those of the apparatus described above with reference to one or more of the FIGS, and can therefore include various features for performing a direct read request from a host device. The resulting system 880 can perform any of a wide variety of functions, such as memory storage, data processing, and/or other suitable functions. Accordingly, representative systems 880 can include, without limitation, hand-held devices (e.g., mobile phones, tablets, digital readers, and digital audio players), computers, vehicles, appliances and other products. Components of the system 880 may be housed in a single unit or distributed over multiple, interconnected units (e.g., through a communications network). The components of the system 880 can also include remote devices and any of a wide variety of computer readable media.

From the foregoing, it will be appreciated that specific embodiments of the technology have been described herein for purposes of illustration, but that various modifications may be made without deviating from the disclosure. In addition, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

In the illustrated embodiments above, the apparatuses have been described in the context of NAND Flash devices. Apparatuses configured in accordance with other embodiments of the present technology, however, can include other types of suitable storage media in addition to or in lieu of NAND Flash devices, such as, devices incorporating NOR-based non-volatile storage media (e.g., NAND flash), magnetic storage media, phase-change storage media, ferroelectric storage media, dynamic random access memory (DRAM) devices, etc.

The term "processing" as used herein includes manipulating signals and data, such as writing or programming, reading, erasing, refreshing, adjusting or changing values, calculating results, executing instructions, assembling, transferring, and/or manipulating data structures. The term data structure includes information arranged as bits, words or code-words, blocks, files, input data, system-generated data, such as calculated or generated data, and program data. Further, the term "dynamic" as used herein describes processes, functions, actions or performance occurring during operation, usage, or deployment of a corresponding device, system or embodiment, and after or while running manufacturer's or third-party firmware. The dynamically occurring processes, functions, actions or performances can occur after or subsequent to design, manufacture, and initial testing, setup or configuration.

The above embodiments are described in sufficient detail to enable those skilled in the art to make and use the embodiments. A person skilled in the relevant art, however, will understand that the technology may have additional embodiments and that the technology may be practiced without several of the details of the embodiments described above with reference to one or more of the FIGS. described above.

We claim:

1. A memory device, comprising:
 a memory array including rewritable memory cells configured to store charges representative of stored data; and
 a memory controller operably coupled to the memory array and configured to:
  perform an initial implementation of a touch up operation to restore the stored charges to offset or reverse charge loss and maintain the stored data; and
  determine a schedule for performing subsequent implementations of the touch up operation, wherein the schedule includes different delays between successive implementations of the touch up operation, wherein the different delays follow a predetermined increasing non-linear pattern.

2. The memory device of claim 1, wherein the non-linear pattern is a logarithmic pattern.

3. The memory device of claim 1, wherein the delays between the successive implementations of the touch up operations increase by at least an order of magnitude.

4. The memory device of claim 3, wherein the delays include at least one of:
 a first delay of n hours between a device-initialization event and the initial implementation of the touch up operation;
 a second delay between the initial implementation and a second implementation of the touch up operation, wherein the second delay is greater than the first delay by at least a factor of 10; and
 a third delay between the second implementation and a third implementation of the touch up operation, wherein the third delay is greater than the second delay by at least a factor of 10.

5. The memory device of claim 3, wherein the schedule specifies timings for a sequence of first three to five successive implementations of the touch up operation following a device-initialization event.

6. The memory device of claim 1, wherein the memory controller is further configured to implement a staggered discharge operation at an end portion of a data access operation that occurs during the touch up operation, the data access operation for a selected wordline (WL) and ending at a reference time, and wherein the staggered discharge operation includes discharging surrounding WLs at different times following the reference time for ensuring that a pillar potential returns to a reset level, wherein the surrounding WLs include WLs that are located adjacent to or within a predetermined number of WLs from the selected WL.

7. The memory device of claim 6, wherein the memory controller is configured to discharge one or more first adjacent WLs physically located directly adjacent to the selected WL following a first delay measured from the reference time.

8. The memory device of claim 7, wherein the memory controller is configured to discharge one or more second adjacent WLs that are physically located directly adjacent to the one or more first adjacent WLs opposite the selected WL, wherein the one or more second adjacent WLs are discharged after a second delay measured from the reference time, wherein the second delay is greater than the first delay.

9. The memory device of claim 6, wherein the surrounding WLs include WLs physically located on one side of and adjacent to the selected WL.

10. The memory device of claim 9, wherein the memory controller is configured to discharge the WLs located on the one side without discharging WLs on a second side opposite the surrounding WLs when the selected WL is within a threshold number of WLs from a boundary on the second side.

11. The memory device of claim 6, wherein the surrounding WLs include a first set of WLs and a second set of WLs located adjacent to the selected WL, the first and second sets of WLs on opposite sides of the selected WL.

12. The memory device of claim 6, wherein the surrounding WLs include a set of three, four, or five WLs arranged directly adjacent to one or each side of the selected WL.

13. The memory device of claim 1, wherein the memory controller is configured to implement the touch up operation during idle time and.

14. The memory device of claim 1, wherein:
 the rewritable memory cells include non-volatile memory cells having a storage capacity of two bits-per-cell (BPC) or greater; and
 the memory controller is configured to determine the schedule for refreshing the memory cells having two BPC or greater.

15. The memory device of claim 1, wherein:
 the rewritable memory cells include non-volatile memory cells having different storage capacities; and
 the memory controller is configured to determine the schedule for refreshing a subset of memory cells having at least a threshold number of bits-per-cell density.

16. A method of operating a memory device that includes rewritable memory cells configured to store charges representative of stored data, the method comprising:
 determining a schedule for refreshing the stored data based on restoring the stored charges to reverse or offset charge loss; and
 according to the schedule, implementing refresh operations that refresh the stored data, wherein delays between successive implementations of the refresh operations differ from each other according to a predetermined increasing non-linear pattern.

17. The method of claim 16, wherein the determined schedule includes the delays between the successive implementations that increase according to a logarithmic pattern.

18. The method of claim 16, wherein:
the determined schedule specifies implementation timings up to three, four, or five implementations of the refresh operations following a device-initialization event; and
implementing the refresh operations include implementing the scheduled three, four, or five refresh operations during idle times as background operations;
further comprising:
identifying an idle time before each implementation of the refresh operations.

19. The method of claim 16, further comprising:
implementing a staggered discharge operation at an end portion of a data access operation on a selected word-line (WL), wherein the staggered discharge operation includes discharging surrounding WLs at different times following a reference time associated with a state change at the selected WL, wherein the surrounding WLs include WLs that are located adjacent to or within a predetermined number of WLs from the selected WL.

20. The method of claim 19, wherein the surrounding WLs include a set of three, four, or five WLs arranged directly adjacent to one or each side of the selected WL.

21. A memory device, comprising:
rewritable memory cells configured to store charges representative of stored data; and
a refresh circuit coupled to the rewritable memory cells and configured to implement a refresh operation to restore the stored charges to offset or reverse charge loss and maintain the stored data, wherein the refresh circuit is configured to implement the refresh operation according to a schedule that includes increasing delays according to a predetermined non-linear pattern between successive implementations of the refresh operation.

* * * * *